US011482655B2

(12) United States Patent
Yoon et al.

(10) Patent No.: US 11,482,655 B2
(45) Date of Patent: Oct. 25, 2022

(54) THERMOELECTRIC MEASUREMENT SYSTEM AND THERMOELECTRIC DEVICE BASED ON LIQUID EUTECTIC GALLIUM-INDIUM ELECTRODE

(71) Applicant: Korea University Research and Business Foundation, Seoul (KR)

(72) Inventors: Hyo Jae Yoon, Seoul (KR); Sohyun Park, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 17/284,492

(22) PCT Filed: Aug. 21, 2019

(86) PCT No.: PCT/KR2019/010613
§ 371 (c)(1),
(2) Date: Apr. 12, 2021

(87) PCT Pub. No.: WO2020/080664
PCT Pub. Date: Apr. 23, 2020

(65) Prior Publication Data
US 2021/0376216 A1    Dec. 2, 2021

(30) Foreign Application Priority Data

Oct. 17, 2018 (KR) .................. 10-2018-0123838

(51) Int. Cl.
*H01L 35/32* (2006.01)
*G01N 25/18* (2006.01)
(Continued)

(52) U.S. Cl.
CPC ............. *H01L 35/32* (2013.01); *G01N 25/18* (2013.01); *H01L 35/20* (2013.01); *H01L 35/34* (2013.01)

(58) Field of Classification Search
CPC .......... H01L 35/32; H01L 35/20; H01L 35/34; G01N 25/18
See application file for complete search history.

(56) References Cited

U.S. PATENT DOCUMENTS

2017/0288114 A1*  10/2017  Katz ...................... C08L 65/00
2017/0317261 A1   11/2017  Ozturk et al.

FOREIGN PATENT DOCUMENTS

| JP | 2008-305986 A   | 12/2008 |
| JP | 2017-211271 A   | 11/2017 |
| KR | 10-2015-0053488 A | 5/2015 |

OTHER PUBLICATIONS

Rincon-Garcia et al., "Thermopower measurements in molecular junctions", Chem. Soc. Rev., 2016, 45, 4285-4306. (Year: 2016).*

(Continued)

*Primary Examiner* — Tae-Sik Kang
(74) *Attorney, Agent, or Firm* — NSIP Law

(57) ABSTRACT

The present invention relates to a thermoelectric measurement system based on a liquid eutectic gallium-indium electrode, whereby thermoelectric performance can be measured with excellent efficiency and high reproducibility even without construction of expensive equipment, various organic molecules as well as large-area molecular layers can be measured, and various thermoelectric materials, such as inorganic materials and inorganic-organic composite materials, can be measured. In addition, non-toxic liquid metal EGaIn is used as an upper electrode, so the damage to even a substance of measurement in the form of a nano-level thin film can be minimized, and the measurement of thermoelectric performance can be performed on even nano- to micro-level organic thermoelectric elements. Therefore, the thermoelectric measurement system is widely utilized across the thermoelectric element industry.

10 Claims, 7 Drawing Sheets

(51) Int. Cl.
    *H01L 35/20*   (2006.01)
    *H01L 35/34*   (2006.01)

(56) References Cited

OTHER PUBLICATIONS

Nijhuis et al., "Comparison of SAM-Based Junctions with Ga2O3/EGaIn Top Electrodes to Other Large-Area Tunneling Junctions", J. Phys. Chem. C 2012, 116, 14139-14150. (Year: 2012).*

Kong et al., "EGaIn Microelectrode for Electrical Characterization of ITO-Based van der Waals Interface and Airborne Molecular Contamination of ITO Surface", Journal of The Electrochemical Society, 162 (9) H703-H712 (2015). (Year: 2015).*

Shin et al., "Thermopower Measurement of Single Nanowire Using a MEMS Device", XX IMEKO World Congress Metrology for Green Growth, Sep. 9-14, 2012, Busan, Republic of Korea (Year: 2012).*

Chen et al., "Thin Film Thermoelectric Materials: Classification, Characterization, and Potential for Wearable Applications", Coatings 2018, 8, 244. (Year: 2018).*

Dickey, Michael D., et al., "Eutectic Gallium-Indium (EGaIn): A Liquid Metal Alloy for the Formation of Stabe Structures in Microchannels at Room Temperature," *Advanced functional materials*, 18, 7, 2008 (pp. 1097-1104).

Kong, Gyu Don et al., "EGaIn Microelectrode for Electrical Characterization of ITO-Based Van der Waals Interface and Airborne Molecular Contamination of ITO Surface," *Journal of The Electrochemical Society*, 162, 9, 2015 (10 pages in English).

International Search Report dated Dec. 16, 2019 in counterpart International Patent Application No. PCT/KR2019/010613 (2 pages in English and 2 pages in Korean).

Korean Notice of Allowance dated May 28, 2020 in counterpart Korean Patent Application No. 10-2018-0123838 (3 pages in Korean).

* cited by examiner

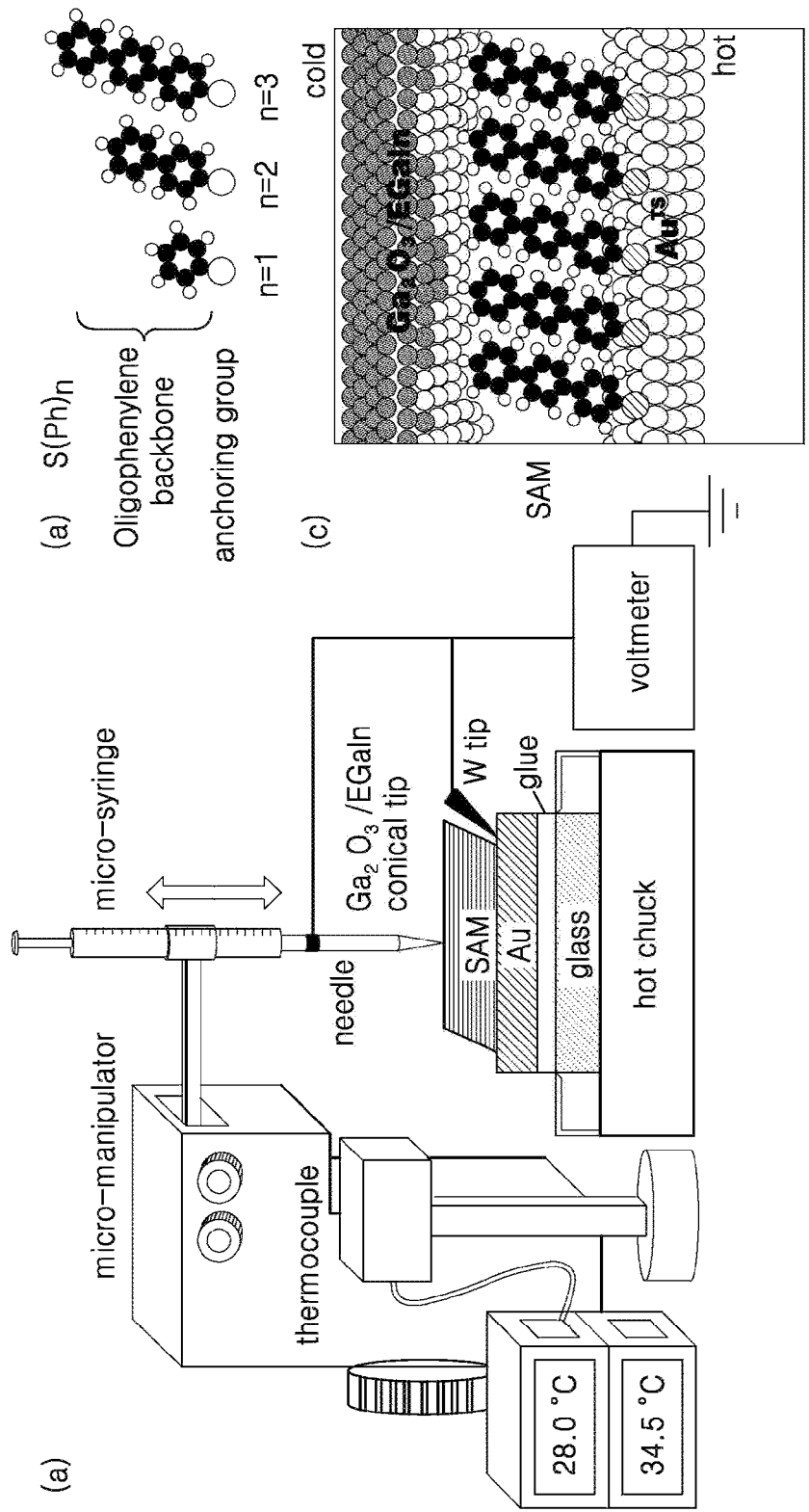
[Fig. 1]

[Fig. 2]
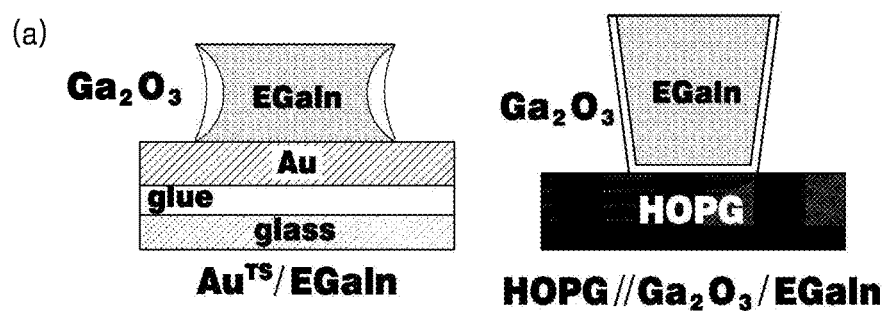
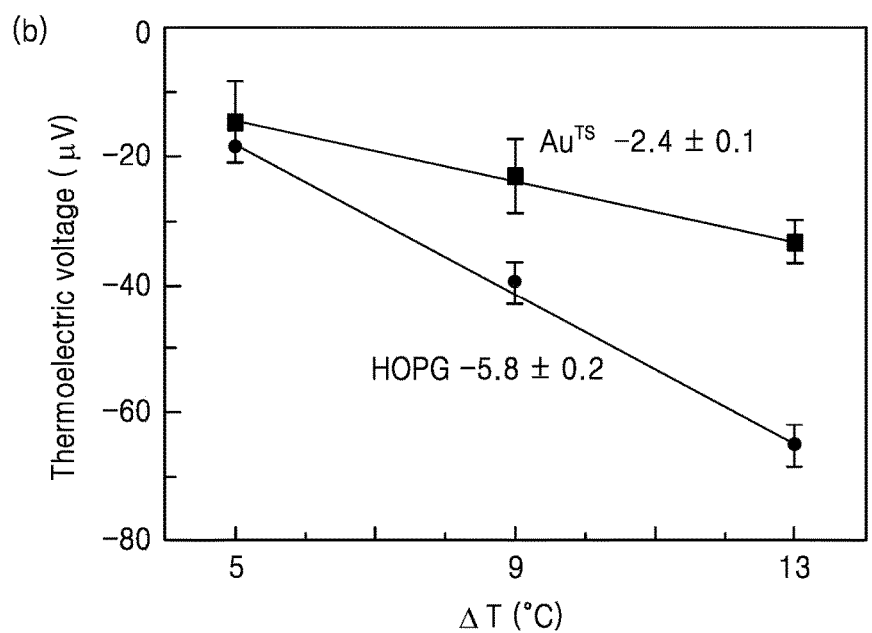

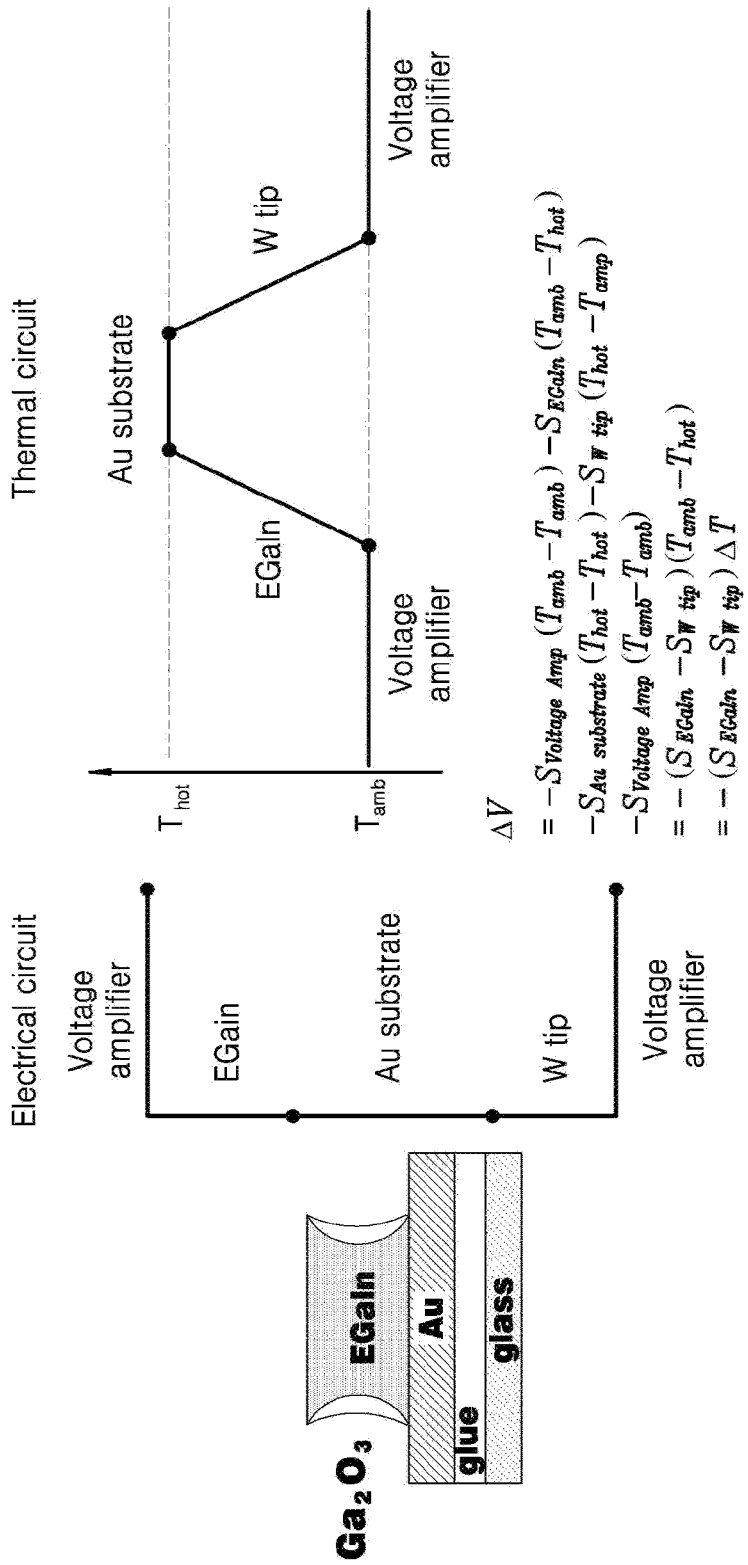
[Fig. 3]

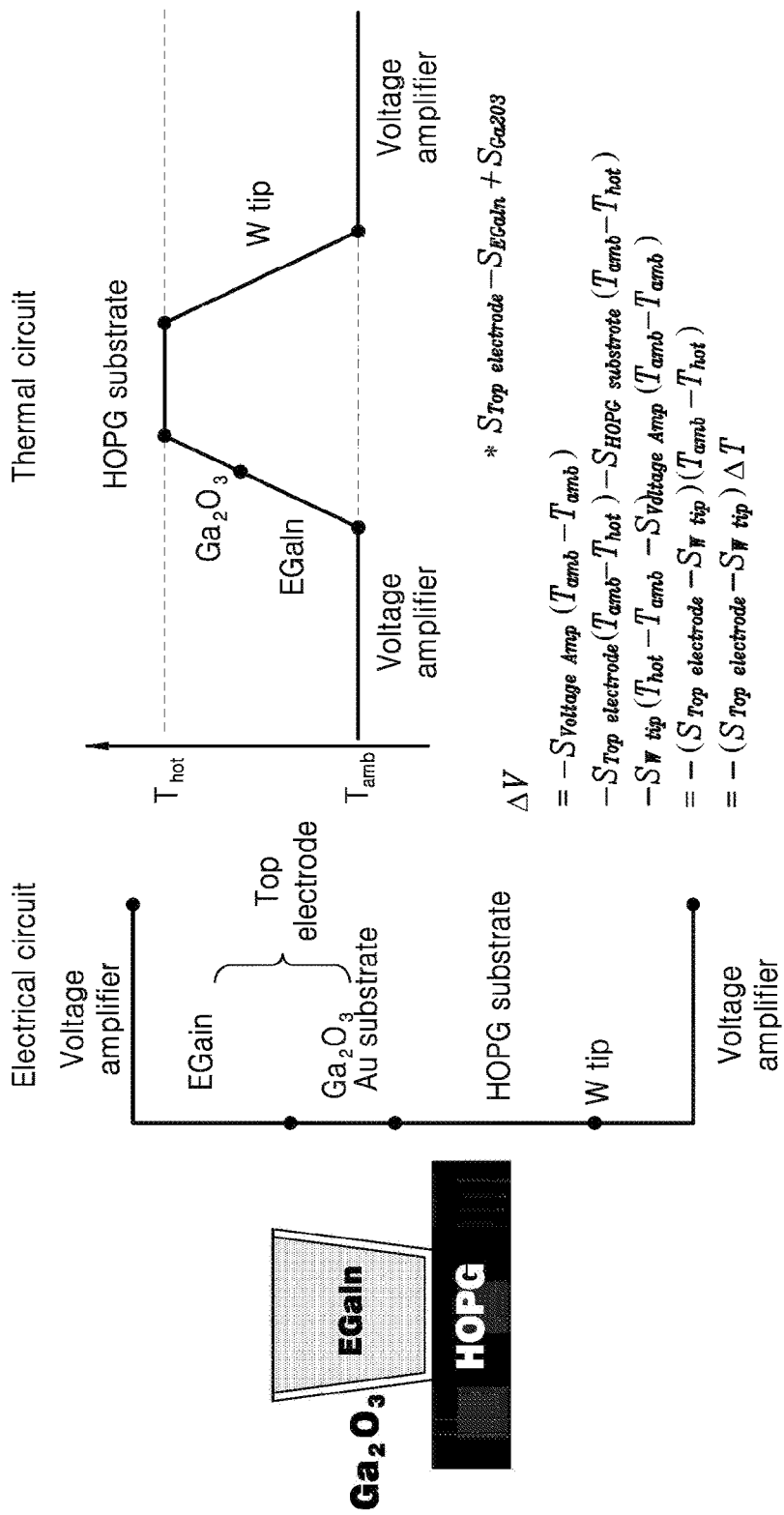
[Fig. 4]

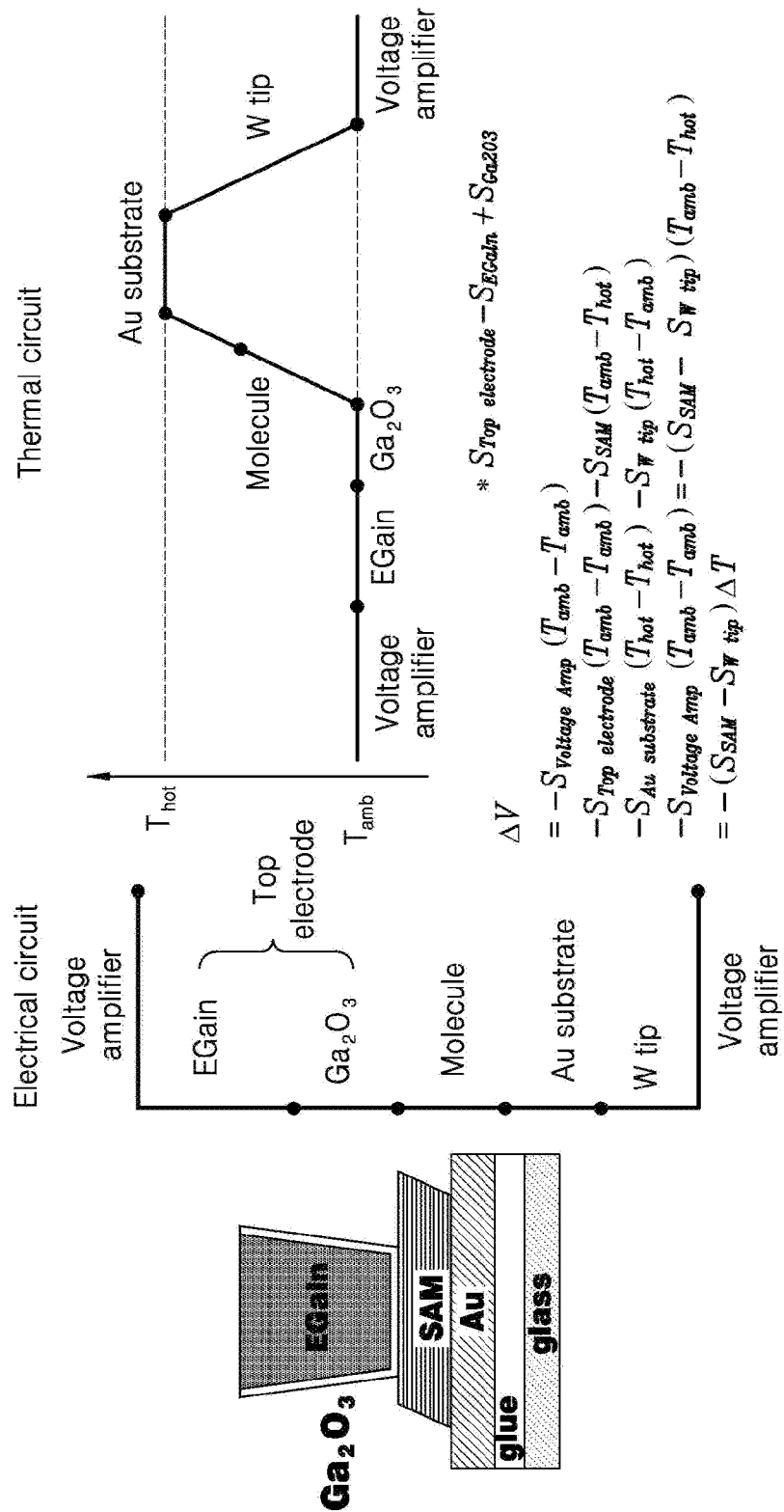
[Fig. 5]

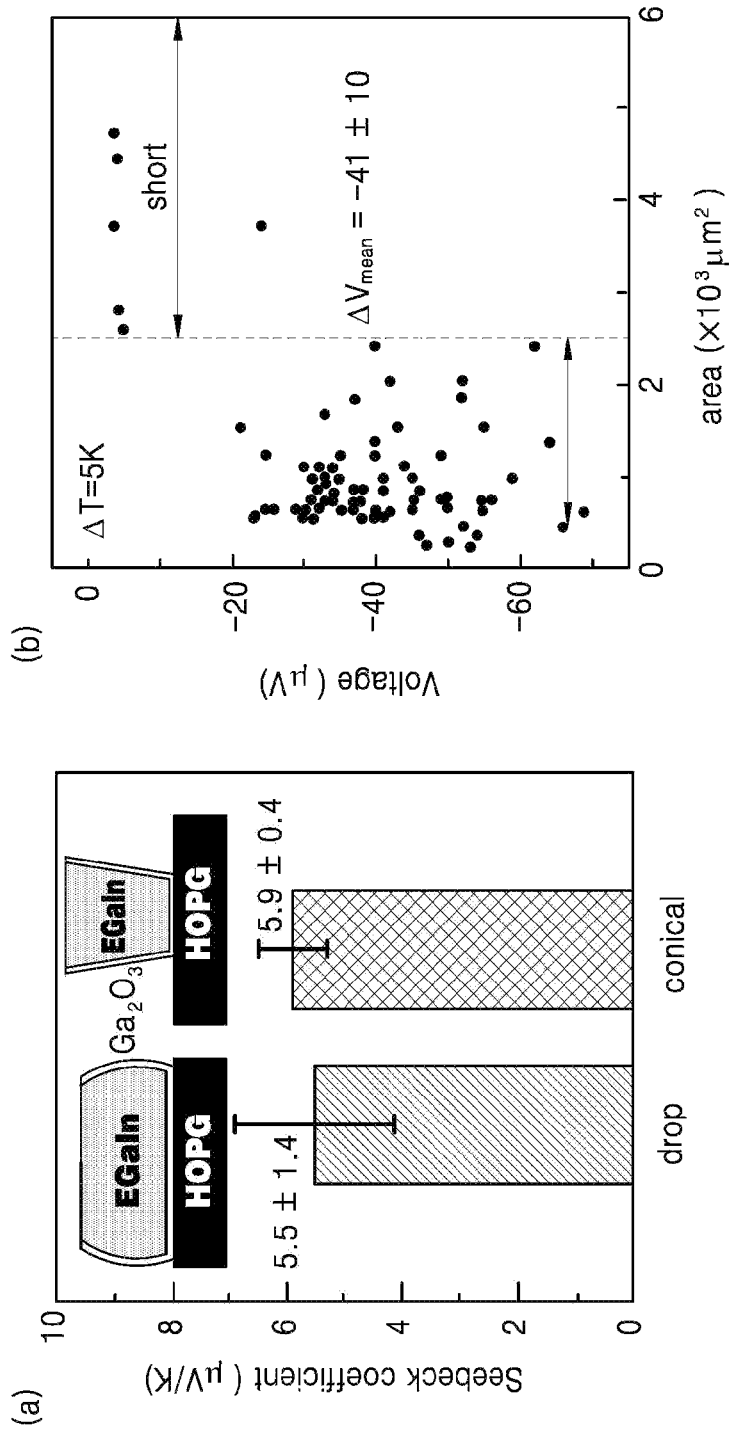
[Fig. 6]

[Fig. 7]
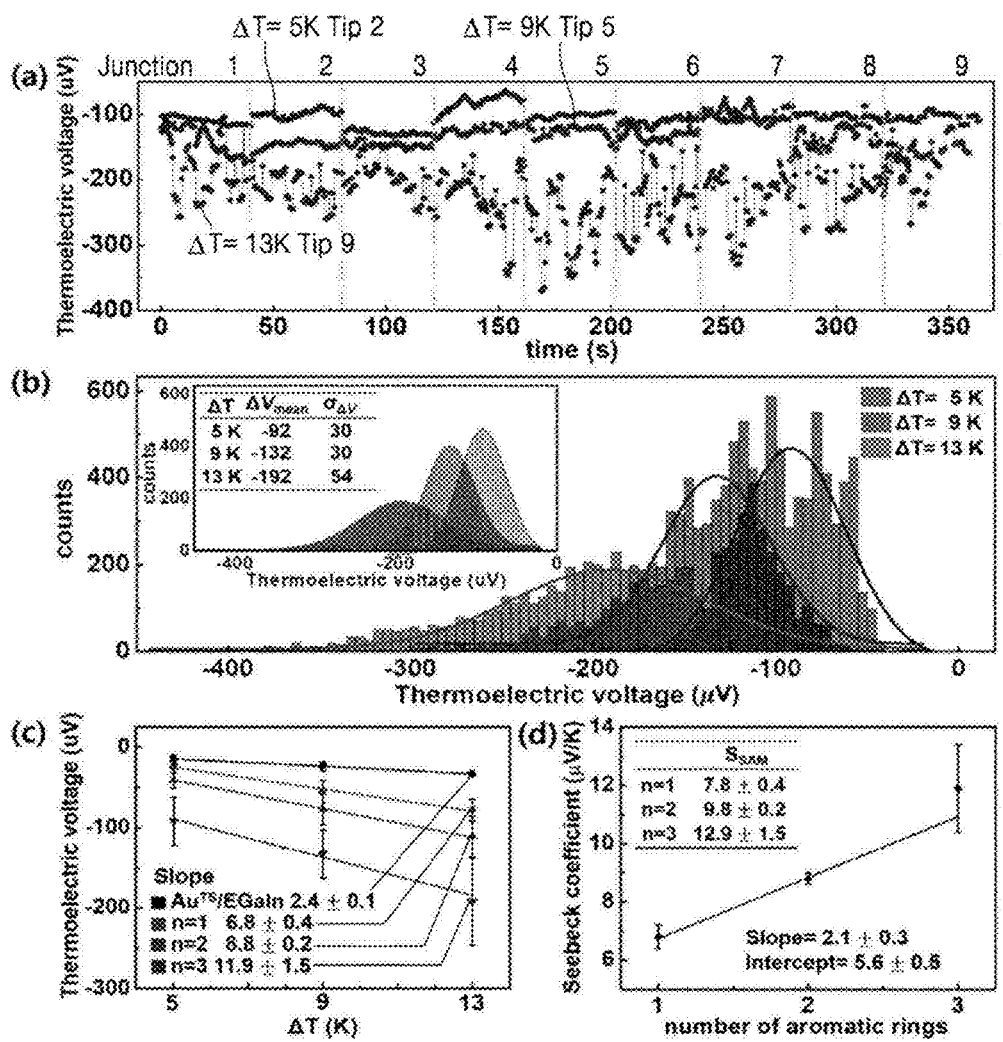

THERMOELECTRIC MEASUREMENT SYSTEM AND THERMOELECTRIC DEVICE BASED ON LIQUID EUTECTIC GALLIUM-INDIUM ELECTRODE

CROSS REFERENCE TO RELATED APPLICATIONS

This application is a U.S. National Stage Application of International Application No. PCT/KR2019/010613, filed on Aug. 21, 2019, which claims the benefit under 35 USC 119(a) and 365(b) of Korean Patent Application No. 10-2018-0123838, filed on Oct. 17, 2018, in the Korean Intellectual Property Office, the entire disclosure of which is incorporated herein by reference for all purposes.

TECHNICAL FIELD

The present invention relates to a thermoelectric measurement system and a thermoelectric device. More specifically, the present invention relates to a thermoelectric measurement system based on a liquid eutectic gallium-indium electrode and a thermoelectric device based on a liquid eutectic gallium-indium electrode and including a molecular layer formed by self-assembly on an electrode.

BACKGROUND ART

Organic thermoelectric materials refer to materials that convert thermal energy into electricity. Organic thermoelectric materials are very interesting from both environmental and scientific points of view in that they recycle thermal energy, which is the final form of energy. Organic thermoelectric materials enable harvesting of eco-friendly energy in situations where a temperature difference exists, have the advantages of bendability and stretchability, and can be processed at low cost.

For the application of such organic materials to thermoelectric devices, it is necessary to elucidate on a molecular level how the chemical and electronic structures of organic active components are related to the thermoelectric performance of the devices.

However, the complex structures of molecules and/or polymers incorporated into most organic thermoelectric devices lead to ill-defined solid-state surface structures and unclear interfacial properties between the molecules and between the molecules and electrodes, making it difficult to achieve the desired results.

The thermal performance of micro- and nano-scale devices is steadily gaining particular importance but understanding of the relationship between structural and thermal properties of micro- and nano-scale devices at the atomic level is still limited. Development of thermoelectric materials with high efficiency and understanding of the structure-property relations for thermoelectric properties are currently the subject of intense research in this field. Ultimately, more studies need to be done at a molecular level to achieve these goals.

Indeed, few studies have been conducted on molecular-scale thermoelectrics than on molecular-scale electronics. Nanoscale platforms that allow high yield, convenience, and ease in thermoelectric measurements with high reliability and reproducibility are required for thermoelectric research on a molecular level. Moreover, the platforms should not damage ultrathin delicate organic films, self-assembled monolayers during device fabrication and thermoelectric measurements.

DETAILED DESCRIPTION OF THE INVENTION

Problems to be Solved by the Invention

Therefore, the present invention intends to provide a thermoelectric measurement system based on a liquid eutectic gallium-indium electrode that is efficient enough to meet the above-described requirements and is highly reliable and reproducible in measurement.

The present invention also intends to provide a thermoelectric device including a self-assembled molecular layer and based on a liquid eutectic gallium-indium electrode.

Means for Solving the Problems

One aspect of the present invention provides a thermoelectric measurement system for measuring a voltage value based on a temperature difference between a liquid metal top electrode and a metal bottom electrode.

The thermoelectric measurement system of the present invention is based on a conical non-Newtonian liquid metal electrode having a surface on which a conductive thin (about 1 nm thick) gallium oxide ($Ga_2O_3$) layer is formed by self-passivation.

Specifically, the thermoelectric measurement system of the present invention includes: a top electrode; a bottom electrode opposite to the top electrode; and a junction in contact with the top and bottom electrodes and including a sample whose thermoelectric properties are to be measured, wherein the top electrode is made of a liquid metal.

Any liquid metal may be used for the top electrode as long as it has a low melting temperature, exhibits fluidic behavior, and has intrinsic properties of fluid such as high surface tension. The liquid metal is preferably a harmless and stable eutectic alloy such as eutectic gallium-indium (EGaIn) or eutectic gallium-indium-tin (EGaInSn).

According to one embodiment of the present invention, the top electrode may be an electrode based on a eutectic gallium-indium (EGaIn) alloy.

The top electrode is in the form of a conical tip and has a surface on which a conductive gallium oxide ($Ga_2O_3$) layer is formed by self-passivation.

A thermocouple may be provided on the top electrode or the bottom electrode to measure a temperature change based on the Seebeck effect.

The thermoelectric measurement system of the present invention may further include a nanovoltmeter that measures a thermoelectric voltage ($\Delta V$) at the junction.

The thermoelectric measurement system of the present invention may further include a hot chuck that controls the temperature of the bottom electrode and creates a temperature difference ($\Delta T$) at the junction.

The thermoelectric measurement system of the present invention may further include a tungsten (W) tip as a grounding electrode.

The thermoelectric measurement system of the present invention is constructed to measure a voltage value based on a temperature difference between the liquid metal top electrode and the metal bottom electrode. Any thermoelectric material may be used without limitation as the sample. For example, the sample may be an inorganic semiconductor, an organic monomolecular compound, a conductive polymer, a conductive polymer-nanocarbon composite or a conductive polymer-inorganic semiconductor hybrid composite.

According to a specific embodiment of the present invention, the sample may be a self-assembled molecular layer bound to the surface of the bottom electrode.

The present invention also provides a thermoelectric device including a top electrode, a bottom electrode opposite to the top electrode, and a molecular layer formed on the bottom electrode wherein the molecular layer is formed by self-assembly of an oligophenylene thiol represented by $S(Ph)_n$ (wherein Ph is a phenyl group and n is an integer from 1 to 10) and the top electrode is an electrode based on a liquid eutectic gallium-indium (EGaIn) alloy.

The thermoelectric performance (Seebeck coefficient) of the thermoelectric device according to the present invention is enhanced as n increases.

Effects of the Invention

The thermoelectric measurement system of the present invention can measure the thermoelectric performance of samples, including large-area molecular layers and thermoelectric materials such as inorganic and organic-inorganic composite materials as well as various organic molecules, with high efficiency and reproducibility without the need for expensive equipment.

In addition, the use of EGaIn as a non-toxic liquid metal for the top electrode enables the measurement of the thermoelectric performance of nano- to micro-scale organic thermoelectric devices while minimizing damage to samples in the form of nano-scale thin films. Therefore, the thermoelectric measurement system of the present invention can be widely used across the thermoelectric device industry.

Furthermore, the thermoelectric measurement system of the present invention can be used to demonstrate the thermoelectric and electrical properties of various organic molecules, thus enabling the development of various organic thermoelectric devices.

BRIEF DESCRIPTION OF THE DRAWINGS

FIG. 1 shows (a) a schematic diagram of a thermoelectric measurement system based on liquid EGaIn according to the present invention, (b) molecules used in exemplary embodiments of the present invention, and (c) a schematic diagram illustrating the structure of a large-area thermoelectric junction.

FIG. 2 shows (a) a schematic diagram of a junction structure of $Au^{TS}$ and an EGaIn conical tip ($Au^{TS}$/EGaIn) and a junction structure of highly ordered pyrolytic graphite (HOPG) and an EGaIn conical tip (HOPG//$Ga_2O_3$/EGaIn) and (b) a plot of thermoelectric voltages ($\Delta V$, µV) as a function of the temperature difference ($\Delta T$, K) at an $Au^{TS}$/HOPG junction.

FIG. 3 is a diagram showing the results of thermopower analysis for an $Au^{TS}$/EGaIn junction.

FIG. 4 is a diagram showing the results of thermopower analysis for a HOPG//$Ga_2O_3$/EGaIn junction.

FIG. 5 is a diagram showing the results of thermopower analysis for an $Au^{TS}$/SAM//$Ga_2O_3$/EGaIn junction.

FIG. 6 shows (a) Seebeck coefficients of HOPG//$Ga_2O_3$/EGaIn junctions, where the EGaIn had different shapes (spherical drop and conical tip) and (b) a plot of thermoelectric voltages as a function of the geometric contact area of an $Au^{TS}$/$S(Ph)_n$//$Ga_2O_3$/EGaIn junction at $\Delta T=5K$.

FIG. 7 shows (a) thermoelectric data obtained by varying the numbers of repeated measurements, junctions, electrode tips, and samples according to exemplary embodiments of the present invention, (b) an exemplary histogram of $\Delta V$ for $S(Ph)_3$ SAM, (c) a plot of $\Delta V_{mean}$ as a function of $\Delta T$, and (d) a plot of $S_{SAM}$ as a function of molecular length (n) of $S(Ph)_n$.

BEST MODE FOR CARRYING OUT THE INVENTION

The present invention will now be described in more detail.

The present invention is directed to an efficient thermoelectric device based on a large-area junction structure and a thermoelectric measurement system platform including the thermoelectric device. The thermoelectric measurement system platform is based on a conical electrode composed of a eutectic gallium-indium alloy as a non-Newtonian liquid metal and having a surface on which a conductive thin (about 1 nm thick) gallium oxide ($Ga_2O_3$) layer is formed by self-passivation.

The thermoelectric measurement system of the present invention is constructed to measure a voltage value based on a temperature difference between a liquid EGaIn top electrode and a metal bottom electrode.

The construction of the EGaIn-based thermoelectric measurement system according to the present invention is shown in (a) of FIG. 1.

The thermoelectric measurement system of the present invention essentially includes the following elements: (i) a micromanipulator adapted to form a $Ga_2O_3$/EGaIn top electrode in the form of a conical tip and a junction; (ii) a thermocouple adapted to measure a temperature change in the bottom electrode based on the Seebeck effect; (iii) a nanovoltmeter adapted to measure a thermoelectric voltage ($\Delta V$) at the junction; (iv) a hot chuck adapted to control the temperature of the bottom electrode and create a temperature difference ($\Delta T$) at the junction; and (v) a tungsten (W) tip as an grounding electrode.

The thermoelectric measurement system of the present invention will be described with reference to the following exemplary embodiments.

As can be seen in (a) of FIG. 1, the electrode in the form of a conical tip is composed of a eutectic gallium-indium alloy as a non-Newtonian liquid metal and enables reversible and noninvasive thermoelectric contact with the upper surface of an organic thin film such as a self-assembled monolayer (SAM) under normal atmospheric conditions.

Due to the advantageous features of the EGaIn top electrode, a sufficiently large amount of thermoelectric data to draw a statistically robust inference about the relationship between the structure and characteristics of the thermoelectric measurement system can be obtained in a reliable and reproducible manner.

In exemplary embodiments of the present invention, oligophenylene thiolates ($S(Ph)_n$, wherein n is an integer from 1 to 3, see (b) of FIG. 1), which have been extensively investigated in the thermoelectric field, are used, a large-area junction ($Au^{TS}$/$S(Ph)_n$//$Ga_2O_3$/EGaIn, wherein $Au^{TS}$ is a template-stripped (TS) ultrathin gold (Au) electrode (see (c) of FIG. 1)) is formed, and thermopowers are measured to verify the thermoelectric device and the thermoelectric measurement system platform of the present invention.

The formation of the self-assembled monolayer (SAM) on the $Au^{TS}$ substrate in the thermoelectric measurement system of the present invention minimizes the degree of structural defects caused by the roughness of the substrate. When a temperature difference is created, the $\Delta V$ value is measured in µV and the Seebeck coefficient (S, µV/K; $S=-\Delta V/\Delta T$) is estimated.

First, the thermopowers of all internal components of the thermoelectric measurement system according to the present invention are measured. In exemplary embodiments of the present invention, a short-circuited junction is formed on the $Au^{TS}$, as shown in (a) of FIG. 2, and the thermopower of the EGaIn is measured. When short-circuited, the EGaIn comes into direct contact with the gold (Au). The thermopowers of the other components such as the $Ga_2O_3$ layer, and the SAM are also measured, which will be specifically described in the following embodiments.

That is, the thermopower and temperature profiles of all components of the system circuit are measured according to the previous method reported by a research group led by Segalman and Majumdar, and the measured output voltages are evaluated.

In one exemplary embodiment of the present invention, the $\Delta V/\Delta T$ measured at the junction is $-2.4\pm0.1$ μV/K (see (b) of FIG. 2) and the $\Delta V$ measured at the circuit by thermopower analysis (see FIG. 3) is $-(S_{EGaIn}-S_{Wtip})\Delta T$ (where $S_{EGaIn}$ and $S_{Wtip}$ are the thermopowers of the EGaIn and the W tip, respectively, $S_{Wtip}$ is 1.0 μV/K, and $S_{EGaIn}$ is $3.4\pm0.1$ μV/K, see Table 1).

In one exemplary embodiment of the present invention, a $HOPG//Ga_2O_3/EGaIn$ junction is formed in which a van der Waals contact is formed while maintaining the $Ga_2O_3$ layer and the thermopower of the $Ga_2O_3$ layer on the EGaIn conical tip is measured ((a) of FIG. 2). The $\Delta V/\Delta T$ measured at the HOPG junction is $-5.8\pm0.2$ μV/K ((b) of FIG. 2) and the $\Delta V$ is $-(S_{Top\ electrode}-S_{Wtip})\Delta T$ (where $S_{Top\ electrode}=S_{EGaIn}+S_{Ga2O3}$) (FIG. 4). The $S_{Top\ electrode}$ and $S_{Ga2O3}$ are $6.8\pm0.2$ μV/K and $3.4\pm0.2$ μV/K, respectively, which are similar to those of metals such as gold, silver, and copper (~1.4-1.8 μV/K) (see Table 1).

surface roughness of the EGaIn conical tip does not affect the thermoelectric measurement. Further, the $\Delta V$ values were measured by varying the contact area while increasing the contact pressure of the conical tip using the micromanipulator until the junction was short-circuited. As a result, the $\Delta V$ value had no correlation with the contact area, as shown in (b) of FIG. 6, indicating that the thermoelectric voltage measurement using the EGaIn conical tip was not significantly affected by the contact area and pressure. These results are intrinsic to thermoelectric molecules and are natural considering their sensitivity to the number of molecules at the junction. The geometric contact area was maintained at $3.0\times10^3$ μm² or less.

The thermoelectric device and the thermoelectric measurement system platform of the present invention were verified with oligophenylene thiolates ($S(Ph)_n$).

$\Delta V$ values were measured at $Au^{TS}/S(Ph)_n//Ga_2O_3/EGaIn$ large-area junctions according to the following standard protocol. The $\Delta V$ values were found to be statistically significant.

First, ~100 data points (~50 data points for the monomolecular SAM, SPh) and 10 intersection points per junction were selected at different locations per sample at a specific temperature difference ($\Delta T$). After $\Delta V$ values at 3-10 junctions were measured using the EGaIn conical tip, a tip was newly formed to minimize the influence of contamination on the surface of the old tip. Data were obtained by varying the numbers of repeated measurements, junctions, tips, and samples. Statistics reflecting all data were prepared.

The thermoelectric data measured for the junctions are summarized in Table 2.

TABLE 2

| $S(Ph)_n$ | T (K) | Number of samples | Number of tips | Number of junctions | Counts | $\Delta V_{mean} \pm \sigma_{\Delta V}$ | $\Delta V_{median}$ | yield (%) |
|---|---|---|---|---|---|---|---|---|
| n = 1 | 5 | 5 | 17 | 43 | 3744 | −25 ± 7 | −23 | 81 |
|  | 9 | 5 | 14 | 55 | 4869 | −55 ± 14 | −55 | 69 |
|  | 13 | 3 | 8 | 51 | 3227 | −78 ± 14 | −79 | 51 |
| n = 2 | 5 | 3 | 9 | 55 | 4960 | −41 ± 10 | −39 | 97 |
|  | 9 | 4 | 11 | 68 | 6697 | −77 ± 19 | −76 | 95 |
|  | 13 | 4 | 12 | 77 | 6415 | −111 ± 25 | −111 | 93 |
| n = 3 | 5 | 4 | 12 | 73 | 6533 | −91 ± 30 | −91 | 96 |
|  | 9 | 4 | 11 | 71 | 6644 | −132 ± 30 | −133 | 92 |
|  | 13 | 4 | 13 | 59 | 5403 | −192 ± 54 | −195 | 90 |

TABLE 1

| Metal | S (μV/K) |
|---|---|
| Cu | 1.7 |
| Ag | 1.38 |
| Au | 1.79 |
| Pt | −4.45 |
| Pd | −9.00 |
| W | 1.0 (300 K) |

The surface of the EGaIn conical tip is assumed to be rough from a molecular viewpoint. In the Examples section that follows, the $S_{Ga2O3}$ value was measured at the HOPG when an EGaIn spherical drop having a smoother surface was used instead of the EGaIn conical tip, to determine whether this roughness affected the thermoelectric measurement. As can be seen in (a) of FIG. 6, the thermovoltage of the EGaIn spherical drop/HOPG junction was $5.5\pm1.4$ μV/K, which was indistinguishable from that of the junction with the EGaIn conical tip. These results concluded that the The yields of the working junctions were 51-81% for the monomolecular SPh and 90-97% for both $S(Ph)_2$ and $S(Ph)_3$. (a) of FIG. 7 revealed the independence of the data. The histogram of $\Delta V$ values was fitted with a single Gaussian curve ((b) of FIG. 7) from which the mean value ($\Delta V_{mean}$) and the standard deviation (GAV) were extracted. All data in Table 2 showed mean and median values indicating their statistical significance. The GAV value increased as the $\Delta V$ value increased, which is attributed to a change in molecular structure at high temperatures. (c) of FIG. 7 shows a plot of $\Delta V_{mean}$ versus the temperature difference ($\Delta T$) where the error bars correspond to $\pm\sigma\Delta V$. The circuit of the SAM-based junction shown in FIG. 5 was analyzed. As a result, the $\Delta V$ value was given by Equation 1:

$$\Delta V = -(S_{SAM} - S_{Wtip})\Delta T \qquad (1)$$

The Seebeck coefficients ($S_{SAM}$) of $S(Ph)_n$ SAM were estimated to be $7.8\pm0.4$ (n=1), $9.8\pm0.2$ (n=2), and $12.9\pm1.5$ μV/K (n=3), as calculated by Equation 1. The positive polarity of the $S_{SAM}$ values suggests that the molecular orbital closest to the Fermi level of Ga$_2$O$_3$/EGaIn (−4.3 eV) is the highest occupied molecular orbital (HOMO). The magnitude and polarity of the S$_{SAM}$ values are consistent with the previous results measured at monomolecular and small-area (10$^1$-10$^2$ molecules) junctions.

(d) of FIG. 7 is a plot of S$_{SAM}$ as a function of molecular length (n) of S(Ph)$_n$). As the number of the phenylene moieties (aromatic rings) increased, the Seebeck coefficient (thermoelectric performance) increased linearly. The linear tendency of the Seebeck coefficient for the oligophenylene shows that it can be analyzed by Equation 2:

$$S_{SAM} = S_C + n*\beta^S \quad (2)$$

where n is the length of the molecule (i.e. the number of the phenylene units), $\beta^S$ is the change rate of thermopower with n, and S$_C$ is the thermopower of a hypothetical junction where n is 0 (i.e., a non-short-circuited junction that does not contain SAM).

Equation 2 is derived from the transmission function based on the junction and the Landauer formalism. In the plot of (d) of FIG. 7, the slope ($\beta^S$) and y-intercept (S$_C$) were 2.1±0.3 and 5.6±0.5, respectively. When S$_{SAM}$, S$_{(Ph)n}$, and S$_{S-Au}$ (thermopower at the gold-thiolate interface) satisfy the relationship: S$_{SAM}$=S$_{(Ph)n}$+S$_{S-Au}$, the S$_C$ value probably corresponds to the S$_{S-Au}$ value (5.6±0.5 μV/K).

As discussed above, the presence of the large-area junction with the microelectrode composed of liquid eutectic gallium-indium alloy ensures high efficiency and reproducibility of the thermoelectric measurement platform system according to the present invention.

The system of the present invention can be constructed to measure a voltage value based on a temperature difference between the liquid metal top electrode and the metal bottom electrode. This construction ensures high reliability and reproducibility of the system.

MODE FOR CARRYING OUT THE INVENTION

The present invention will be specifically explained with reference to the following examples. However, these examples are not intended to limit the scope of the present invention.

First, all organic solvents were purchased from Sigma-Aldrich and Daejung and used as supplied. All oligophenylenethiols (HS(Ph)$_n$, where n is an integer from 1 to 3) were purchased from Sigma-Aldrich (purity 97%) and used as supplied. High purity eutectic gallium-indium (EGaIn; 99.99%) was purchased from Sigma-Aldrich and used as supplied. All thiol derivatives were stored under a nitrogen atmosphere at 4° C. Gold thin films (300 nm) were deposited onto silicon thin films (100 mm in diameter, 1-10 Ωcm, 525±50 microns thick) by an electron beam evaporator (ULVAC). Photocurable adhesives were purchased from Norland (NOA81) and used as supplied.

Example 1: Preparation of Self-Assembled Monolayers (SAMs)

A toluene (anhydrous 99.9%) solution (total concentration=3 mM) containing (HS(Ph)$_n$) was placed in a vial. The solution was sealed and degassed by N$_2$ bubbling through the solution for ~10 min. A template-stripped gold (Au$^{TS}$) chip was rinsed with pure toluene and placed in the solution with the exposed metal face up. The vial was then filled with N$_2$. After 3 h incubation at room temperature, the SAM-bound Au$^{TS}$ chip was removed from the solution and rinsed by repeated dipping in clean toluene (3×1 mL). The solvent on the SAM was then evaporated in air for a few seconds.

The characteristics of the SAM were determined through contact angle measurement following the method reported in the literature and by X-ray photoelectron spectroscopy (XPS).

Example 2: Formation of Junction Structure and Measurement of Thermoelectricity (1) A top electrode and a junction were formed following the procedure reported in the literature. The top electrode was prepared in the form of a conical tip based on EGain as a liquid metal. Briefly, a 10 μL gas-tight syringe was filled with EGaIn (≥99.99%, Aldrich). A drop of EGaIn was pushed to the tip of the syringe needle, the hanging drop was brought into contact with a surface on which the EGaIn could stick (e.g., an oxidized Ag surface), and the needle gently pulled away from the drop to obtain a conical tip.

(2) Thermoelectric measurements were performed under normal atmospheric conditions. The SAM was placed on a hot chuck and the remaining portion was covered with glass to block or minimize heat transfer to the EGaIn tip, which can be seen from the schematic diagram of the inventive thermoelectric measurement system based on EGaIn as a liquid metal shown in (a) of FIG. 1. Subsequently, the SAM was brought into contact with a tungsten tip as a grounding electrode and a thermocouple was fixed onto the electrode to measure the temperature of the bottom electrode. A substrate including glass and an optical adhesive (an organic polymer) was used. The thermal conductivities of the glass and the adhesive were ~1 W/mK and 0.2 W/mK, which are about 10 times or more than that of air. Table 3 shows the thermal conductivities of various materials, including general metals, at 273 K. The heat transfer from the hot chuck to the SAM through then Au sufficiently enabled thermoelectric measurements, which was confirmed by monitoring the temperature of the substrate using the thermocouple. Temperature differences were created by varying the temperature of the hot chuck in the range of 301-309 K. At each temperature, a sufficient time was waited to stabilize the temperature measured by the thermocouple at the bottom electrode.

TABLE 3

| Material | κ (W/m-K) |
| --- | --- |
| Ag | 436 |
| Au | 318 |
| Si | ~150 |
| Ga | 30.54 |
| EGaIn (75% Ga, 25% In) | 26.43 |
| β-Ga$_2$O$_3$ | ~20 (300 K) |
| Soda-lime glass | 1.4 |
| Pristine epoxy adhesive | 0.2 |
| Air | ~0.024 |

Then, using a micromanipulator, the EGain conical tip was gently brought into contact with the surface of the SAM. 50-100 points per junction were measured for output voltage. At least 3 samples were prepared. 3-10 different locations per sample were measured for output voltage. After output voltages at 9-10 junctions were measured using the EGaIn conical tip, a new tip was prepared. The yield of each working junction was calculated by the proportion of non-short-circuited junctions in all short-circuited junctions. The short-circuited junction was defined as a junction that shows an $S_{EGaIn}$ of 3.4 µV/K, which is a value obtained for a short-circuited junction of an EGaIn conical tip and $Au^{TS}$ only.

Example 3: Experiment on HOPG Junction

To measure the thermopower of a $Ga_2O_3$ layer on the EGaIn conical tip, a junction was formed on highly ordered pyrolytic graphite (HOPG, 1 cm×1 cm) according to the same procedure. The thermopower of the $Ga_2O_3$ layer on the EGaIn conical tip were measured and compared with that on the EGaIn spherical drop. The geometric contact area was estimated with an optical microscope to determine whether the measured output voltage was dependent on the contact areas. After formation of the junction, the diameter of the geometric contact area was measured at high magnification. Assuming the circular contact, the area was derived from the measured diameter.

Example 4: Analysis of Thermopowers of the Junctions

The thermoelectric performance of each junction was analyzed according to the previous method reported by a research group led by Segalman and Majumdar. The measured thermoelectric voltage was attributed to the thermopower of the junction between the EGaIn tip and the exposed substrate ($Au^{TS}$ or HOPG) or the SAM-bound substrate. The thermopower reflects the slope of $\Delta V$ versus $\Delta T$. The $\Delta T$ occurs at the junction. Without SAM, $\Delta T$ occurs between the EGaIn tip and the tungsten (W) grounding electrode (see FIGS. 3 and 4). In the presence of SAM, $\Delta T$ occurs between the molecule and the W electrode (see FIG. 5). The thermopowers of the EGaIn, $Ga_2O_3$ layer and SAM can be estimated using the equations given in the diagrams of FIGS. 3 to 5.

INDUSTRIAL APPLICABILITY

The thermoelectric measurement system of the present invention can measure the thermoelectric performance of samples, including large-area molecular layers and thermoelectric materials such as inorganic and organic-inorganic composite materials as well as various organic molecules, with high efficiency and reproducibility without the need for expensive equipment.

In addition, the use of EGaIn as a non-toxic liquid metal for the top electrode enables the measurement of the thermoelectric performance of nano- to micro-scale organic thermoelectric devices while minimizing damage to samples in the form of nano-scale thin films. Therefore, the thermoelectric measurement system of the present invention can be widely used across the thermoelectric device industry.

Furthermore, the thermoelectric measurement system of the present invention can be used to demonstrate the thermoelectric and electrical properties of various organic molecules, thus enabling the development of various organic thermoelectric devices.

The invention claimed is:
1. A thermoelectric measurement system, comprising:
a top electrode;
a bottom electrode opposite to the top electrode;
a sample whose thermoelectric properties are to be measured disposed between and in contact with the top electrode and the bottom electrode;
a hot chuck disposed under the bottom electrode controlling a temperature of the bottom electrode and creating a temperature difference ($\Delta T$) at the sample; and
a glass layer disposed on the hot chuck blocking a heat transfer from the hot chuck to the top electrode,
wherein the top electrode is made of a liquid metal.
2. The thermoelectric measurement system according to claim 1, wherein the liquid metal is a eutectic gallium-indium (EGaIn) alloy.
3. The thermoelectric measurement system according to claim 1, wherein the top electrode is in the form of a conical tip and has a surface on which a conductive gallium oxide ($Ga_2O_3$) layer is formed by self-passivation.
4. The thermoelectric measurement system according to claim 1, wherein a thermocouple is provided on either of the top electrode or the bottom electrode to measure a temperature change based on a Seebeck effect.
5. The thermoelectric measurement system according to claim 1, further comprising a nanovoltmeter that measures a thermoelectric voltage ($\Delta V$) at the sample.
6. The thermoelectric measurement system according to claim 1, further comprising a tungsten (W) tip as a grounding electrode.
7. The thermoelectric measurement system according to claim 1, wherein the sample is a thermoelectric material selected from inorganic semiconductors, organic monomolecular compounds, conductive polymers, conductive polymer-nanocarbon composites, and conductive polymer-inorganic semiconductor hybrid composites.
8. The thermoelectric measurement system according to claim 7, wherein the sample is a self-assembled molecular layer bound to a surface of the bottom electrode.
9. A thermoelectric device comprising:
a top electrode;
a bottom electrode opposite to the top electrode;
a molecular layer formed on the bottom electrodes;
a hot chuck disposed under the bottom electrode controlling a temperature of the bottom electrode and creating a temperature difference ($\Delta T$) at the molecular layer; and
a glass layer disposed on the hot chuck blocking a heat transfer from the hot chuck to the top electrode,
wherein the molecular layer is formed by self-assembly of an oligophenylene thiol represented by $S(Ph)_n$, wherein Ph is a phenyl group and n is an integer from 1 to 10, and the top electrode is an electrode based on a liquid eutectic gallium-indium (EGaIn) alloy.
10. The thermoelectric device according to claim 9, wherein a thermoelectric performance of the thermoelectric device is enhanced as n increases.

* * * * *